(12) United States Patent
Priest et al.

(10) Patent No.: US 9,059,562 B2
(45) Date of Patent: Jun. 16, 2015

(54) CONTROL SYSTEM FOR DIRECTING POWER TO A LASER ASSEMBLY

(75) Inventors: Allen Priest, Escondido, CA (US); David P. Caffey, San Diego, CA (US)

(73) Assignee: DAYLIGHT SOLUTIONS, INC., San Diego, CA (US)

( * ) Notice: Subject to any disclaimer, the term of this patent is extended or adjusted under 35 U.S.C. 154(b) by 365 days.

(21) Appl. No.: 13/531,381

(22) Filed: Jun. 22, 2012

(65) Prior Publication Data

US 2015/0101234 A1    Apr. 16, 2015

Related U.S. Application Data

(60) Provisional application No. 61/500,602, filed on Jun. 23, 2011.

(51) Int. Cl.
| | | |
|---|---|---|
| *H01S 3/00* | (2006.01) | |
| *H01S 3/13* | (2006.01) | |
| *H01S 3/10* | (2006.01) | |
| *F41G 1/35* | (2006.01) | |

(52) U.S. Cl.
CPC .... *H01S 3/10* (2013.01); *F41G 1/35* (2013.01)

(58) Field of Classification Search
CPC . H01S 3/0912; H01S 3/09702; H01S 5/0261; H01S 5/06808; H01S 5/06837
USPC .................. 372/38.04, 29.015, 29.02, 29.021
See application file for complete search history.

(56) References Cited

U.S. PATENT DOCUMENTS

| | | | |
|---|---|---|---|
| 4,737,028 A | 4/1988 | Smith | |
| 4,796,266 A | 1/1989 | Banwell et al. | |
| 5,056,097 A * | 10/1991 | Meyers | 372/29.014 |
| 5,082,799 A | 1/1992 | Holmstrom et al. | |
| 5,315,436 A | 5/1994 | Lowenhar et al. | |
| 5,689,520 A * | 11/1997 | Hoang | 372/29.02 |
| 5,751,830 A | 5/1998 | Hutchinson | |
| 5,901,168 A | 5/1999 | Baillargeon et al. | |
| 6,134,257 A | 10/2000 | Capasso et al. | |
| 6,326,646 B1 | 12/2001 | Baillargeon et al. | |
| 6,400,744 B1 | 6/2002 | Capasso et al. | |
| 6,470,036 B1 | 10/2002 | Bailey et al. | |
| 6,553,045 B2 | 4/2003 | Kaspi | |
| 6,560,259 B1 | 5/2003 | Hwang | |

(Continued)

OTHER PUBLICATIONS

Horowitz, et al., "The Art of Electronics", Cambridge University Press, Second Edition, 1989, pp. 180-182.

*Primary Examiner* — Colleen A Matthews
*Assistant Examiner* — Vu A Vu
(74) *Attorney, Agent, or Firm* — Roeder & Broder LLP

(57) ABSTRACT

An assembly (10) for providing an assembly output beam comprises a laser assembly (12), a power source (14), and a system controller (16). The power source (14) is electrically coupled to the laser assembly (12). The system controller (16) directs power from the power source (14) to the laser assembly (12). Additionally, the system controller (16) includes a capacitor assembly (22) that is electrically connected to the laser assembly (12), and a current source (20) that directs power from the power source (14) to the capacitor assembly (22) and the laser assembly (12). The power source (14) and the capacitor assembly (22) cooperate to provide power to the laser assembly (12). Further, the capacitor assembly (22) provides pulses of power and the current source (20) directs the pulses of power to the laser assembly (12). Moreover, the current source (20) charges the capacitor assembly (22) in between the pulses of power.

28 Claims, 6 Drawing Sheets

(56) References Cited

U.S. PATENT DOCUMENTS

| | | |
|---|---|---|
| 6,575,641 B2 | 6/2003 | Yamabayashi et al. |
| 6,636,539 B2 | 10/2003 | Martinsen |
| 6,690,472 B2 | 2/2004 | Kulp et al. |
| 6,738,398 B2 * | 5/2004 | Hirata et al. .................... 372/32 |
| 6,803,577 B2 | 10/2004 | Edner et al. |
| 6,859,481 B2 | 2/2005 | Zheng |
| 7,006,543 B2 | 2/2006 | Self et al. |
| 7,032,431 B2 | 4/2006 | Baum et al. |
| 7,061,022 B1 | 6/2006 | Pham et al. |
| 7,088,076 B2 | 8/2006 | Densham et al. |
| 7,424,042 B2 | 9/2008 | Day et al. |
| 7,466,734 B1 | 12/2008 | Day et al. |
| 7,492,806 B2 | 2/2009 | Day et al. |
| 7,535,656 B2 | 5/2009 | Day et al. |
| 7,535,936 B2 | 5/2009 | Day et al. |
| 7,733,925 B2 | 6/2010 | Pushkarsky et al. |
| 7,796,341 B2 | 9/2010 | Day et al. |
| 7,826,503 B2 | 11/2010 | Day et al. |
| 7,848,382 B2 | 12/2010 | Weida et al. |
| 7,873,094 B2 | 1/2011 | Day et al. |
| 7,920,608 B2 | 4/2011 | Marsland, Jr. et al. |
| 8,027,094 B2 | 9/2011 | Day et al. |
| 8,050,307 B2 | 11/2011 | Day et al. |
| 8,068,521 B2 | 11/2011 | Weida et al. |
| 8,189,630 B2 | 5/2012 | Marsland, Jr. et al. |
| 8,306,077 B2 | 11/2012 | Pushkarsky et al. |
| 8,335,413 B2 | 12/2012 | Dromaretsky et al. |
| 2002/0064198 A1 | 5/2002 | Koizumi |
| 2002/0105699 A1 | 8/2002 | Miracky et al. |
| 2002/0176473 A1 | 11/2002 | Mooradian |
| 2003/0043877 A1 | 3/2003 | Kaspi |
| 2003/0127596 A1 | 7/2003 | Kosterev et al. |
| 2004/0013154 A1 | 1/2004 | Zheng |
| 2004/0208602 A1 | 10/2004 | Plante |
| 2004/0228371 A1 | 11/2004 | Kolodzey et al. |
| 2004/0238811 A1 | 12/2004 | Nakamura et al. |
| 2004/0264523 A1 | 12/2004 | Posamentier |
| 2005/0207943 A1 | 9/2005 | Puzey |
| 2005/0213627 A1 | 9/2005 | Masselink et al. |
| 2006/0056466 A1 | 3/2006 | Belenky et al. |
| 2006/0268947 A1 | 11/2006 | Kalayeh |
| 2007/0030865 A1 | 2/2007 | Day et al. |
| 2007/0291804 A1 | 12/2007 | Day et al. |
| 2008/0075133 A1 | 3/2008 | Day et al. |
| 2008/0144677 A1 * | 6/2008 | Belkin et al. .................... 372/20 |
| 2008/0198027 A1 | 8/2008 | Bugge |
| 2008/0232413 A1 | 9/2008 | Leavitt et al. |
| 2009/0110019 A1 | 4/2009 | Houde-Walter et al. |
| 2009/0224153 A1 | 9/2009 | Houde-Walter |
| 2010/0132581 A1 | 6/2010 | Day et al. |
| 2010/0243891 A1 | 9/2010 | Day |
| 2010/0302796 A1 | 12/2010 | Pushkarsky |
| 2011/0085576 A1 * | 4/2011 | Crawford et al. .......... 372/38.07 |
| 2011/0173870 A1 | 7/2011 | Day |
| 2011/0222566 A1 | 9/2011 | Weida |
| 2012/0039349 A1 | 2/2012 | Priest |
| 2012/0057254 A1 | 3/2012 | Arnone |
| 2012/0068001 A1 | 3/2012 | Pushkarsky |
| 2012/0076160 A1 | 3/2012 | Caffey |
| 2012/0106160 A1 | 5/2012 | Pushkarsky |
| 2012/0210589 A1 | 8/2012 | Marsland et al. |
| 2013/0022311 A1 | 1/2013 | Pushkarsky |

* cited by examiner

CONTROL SYSTEM FOR DIRECTING POWER TO A LASER ASSEMBLY

RELATED INVENTION

This application claims priority on U.S. Provisional Application Ser. No. 61/500,602, filed Jun. 23, 2011 and entitled "CONTROL SYSTEM FOR DIRECTING POWER TO A LASER ASSEMBLY". As far as permitted, the contents of U.S. Provisional Application Ser. No. 61/500,602 are incorporated herein by reference.

GOVERNMENT LICENSE RIGHTS

This invention was made with government support under N00164-11-C-JQ23 awarded by the Department of Defense. The government has certain rights in the invention.

BACKGROUND

Mid Infrared ("MIR") laser sources that produce a fixed wavelength output beam can be used in many fields such as, thermal pointing, medical diagnostics, pollution monitoring, leak detection, analytical instruments, homeland security and industrial process control. Unfortunately, many portable, compact MIR laser sources do not generate an output beam having sufficient power. Moreover, these MIR laser sources can have insufficient operational times when operating on battery power.

SUMMARY

The present invention is directed toward an assembly for providing an assembly output beam comprising a laser assembly, a power source, and a system controller. The power source is electrically coupled to the laser assembly. The system controller directs power from the power source to the laser assembly. In certain embodiments, the system controller includes a capacitor assembly that is electrically connected to the laser assembly, and a current source that directs power from the power source to the capacitor assembly and the laser assembly. Additionally, the current source can be programmable to selectively control current that is directed to the capacitor assembly and the laser assembly.

In one embodiment, the laser assembly includes a mid-infrared laser source.

In some embodiments, the system controller directs pulses of power to the laser assembly. In one such embodiment, the laser assembly has a duty cycle of approximately 12.5 percent. Alternatively, the duty cycle can be controlled to be greater or less than 12.5 percent. As non-exclusive examples, the duty cycle can be controlled to be approximately 5, 9, 10, 11, 12, 13, 14, 15, 20, 25, 30, 40, or 50 percent, or any value that is less than one hundred percent. Stated in another fashion, as non-exclusive examples, the duty cycle can be controlled to be between approximately (i) 5-20 percent, (ii) 10-20 percent, (iii) 20-30 percent, (iv) 30-40 percent, or (v) 40-50 percent.

Additionally, in some such embodiments, the capacitor assembly provides the pulses of power and the current source directs the pulses of power to the laser assembly. Moreover, in one embodiment, the current source charges the capacitor assembly in between the pulses of power.

Additionally, in certain embodiments, the system controller further includes a switch assembly that selectively directs power to the laser assembly. In one such embodiment, the switch assembly includes a current regulator that regulates current to the laser assembly. Further, the laser assembly can include one or more laser sources. In such embodiment, the switch assembly can include one or more switches that are independently controlled to individually direct power to each of the one or more laser sources.

In some embodiments, the laser assembly includes a first laser source and a second laser source. In one such embodiment, the system controller includes a first current regulator that independently regulates current to the first laser source, and a second current regulator that independently regulates current to the second laser source.

Further, the power source can include one or more batteries. In certain embodiments, the power source and the capacitor assembly cooperate to provide power to the laser assembly.

In one embodiment, the system controller selectively adjusts a pulse width and a repetition rate of the assembly output beam.

The present invention is further directed toward a targeting assembly comprising a thermal imager and the assembly as described above. Still further, the present invention is directed toward a weapon assembly comprising a weapon and the targeting assembly.

Moreover, the present invention is still further directed toward a method for providing an assembly output beam, the method comprising the steps of electrically coupling a power source to a laser assembly; electrically connecting a capacitor assembly to a laser assembly; and directing power from the power source to the capacitor assembly and the laser assembly with a current source.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
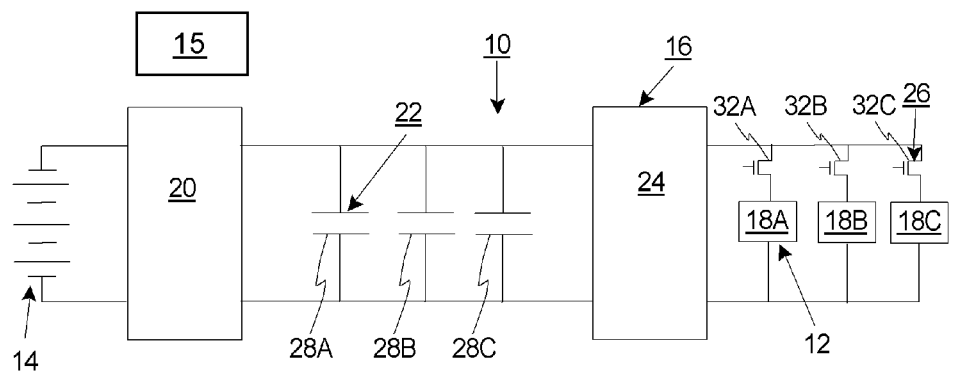
FIG. 1 is a simplified circuit illustration of an assembly including a system controller having features of the present invention.

FIG. 1 is a simplified circuit illustration of an assembly 10 that includes a laser assembly 12, a power source 14, an assembly monitor 15, e.g., a field-programmable gate array ("FPGA"), and a system controller 16 that directs power to the laser assembly 12 to generate an assembly output beam (not shown). The design of the system controller 16 and the laser assembly 12 can be varied to achieve the design requirements of the laser assembly 12. As an overview, the system controller 16 is uniquely designed to provide an increased operational time for an assembly 12 having one or more batteries as the power source 14.

Figure 9:
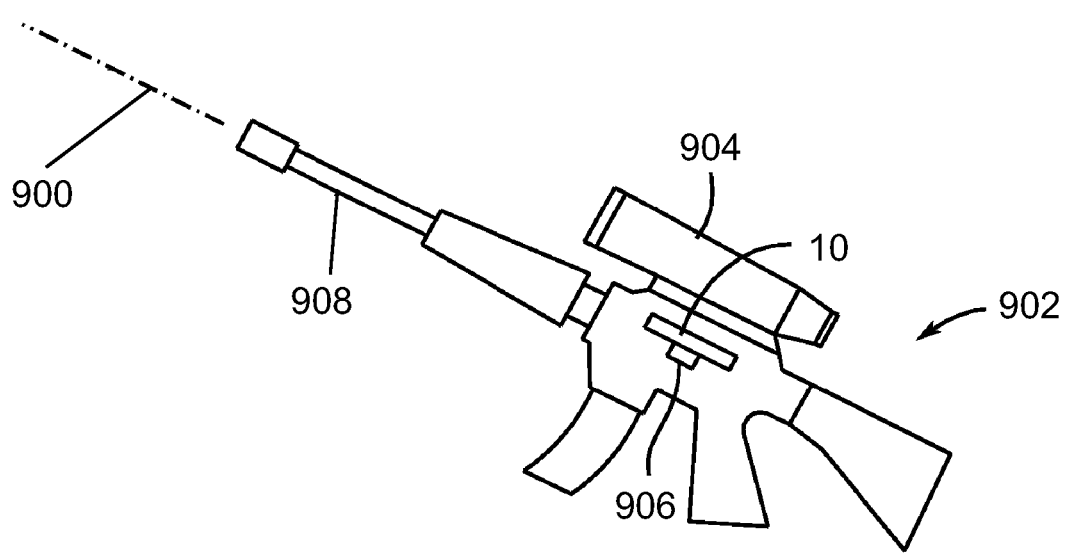
FIG. 9 is a simplified illustration of one application of the assembly illustrated in FIG. 1.

There are a number of possible usages for the assembly 10 disclosed herein. For example, FIG. 9 is a simplified illustration of one potential application for the assembly 10 illustrated in FIG. 1. More specifically, in one non-exclusive embodiment, as shown in FIG. 9, the assembly 10 can be a portable assembly that can be used as part of a thermal pointer that generates an assembly output beam 900 that in is the infrared range, e.g., the mid-infrared range. In this example, the thermal pointer 10 can be used on a weapon 902 (e.g., a rifle or gun) in conjunction with a thermal imager 904 to locate, designate, and/or aim at one or more targets (not shown). Additionally, the thermal pointer 10 can be attached to the weapon 902 by means of a mount 906 to provide the assembly output beam 900, which is aligned along a barrel 908 of the weapon 902 to assist in aiming the weapon 902 at the target, e.g., by projecting an invisible infrared spot on the target.

Alternatively, for example, the assembly 10 can be used for a free space communication system in which the assembly 10 is operated in conjunction with an IR detector located far away, to establish a wireless, directed, invisible data link. Still alternatively, the assembly 10 can be used for any application requiring transmittance of directed infrared radiation through the atmosphere at the distance of thousands of meters, to simulate a thermal source to test IR imaging equipment, as an active illuminator to assist imaging equipment, or any other application. Still alternatively, the assembly 10 can generate an infrared beam that is used in medical diagnostics, pollution monitoring, leak detection, analytical instruments, homeland security and/or industrial process control.

In certain embodiments, the laser assembly 12 includes one or more MIR laser sources that are packaged in a portable, common module. In such embodiments, one or more of the MIR laser sources can generate a narrow linewidth, accurately settable MIR beam (not shown in FIG. 1). Subsequently, the MIR beams can be combined to create the assembly output beam. Further, each of the MIR laser sources can be a single emitter infrared semiconductor laser. As a result thereof, utilizing multiple single emitter infrared semiconductor lasers, the laser assembly 12 can generate a multiple watt assembly output beam.

In one embodiment, the laser assembly 12 includes three laser sources, namely a first laser source 18A, a second laser source 18B, and a third laser source 18C. Alternatively, the laser assembly 12 can be designed to include more than three or fewer than three laser sources 18A-18C.

An important aspect of the MIR beams is the ability to propagate through the atmosphere with minimal absorption. Typically, the atmosphere absorption is mainly due to water and carbon dioxide. Atmospheric propagation requires a narrow linewidth and an accurately settable wavelength to avoid absorption. In certain embodiments, each of the MIR laser sources 18A-18C generates a narrow linewidth MIR beam, and each of the MIR laser sources 18A-18C can be individually tuned so that each MIR beam is at a wavelength that allows for maximum transmission through the atmosphere. Stated in another fashion, the wavelength of each MIR beam is specifically selected to avoid the wavelengths that are readily absorbed by water, carbon dioxide or other atmospheric constituents that may be present.

Further, in certain embodiments, each of the MIR laser sources 18A-18C can be individually tuned so that a specific wavelength of the MIR beams of one or more of the MIR laser sources 18A-18C is the same or different than that of the other MIR laser sources 18A-18C. Thus, the MIR laser sources 18A-18C can be tuned so that the assembly output beam is primarily a single wavelength beam or is primarily a multiple wavelength (incoherent) beam. Further, the power output of the assembly output beam can be adjusted by changing the number of MIR laser sources 18A-18C. As a result thereof, the characteristics of the assembly output beam can be adjusted to suit the application requirements for the laser assembly 12.

Additionally, the laser assembly 12 can include one or more non-MIR laser sources (not shown) that generate a non-MIR beam that is outside the MIR range. In this embodiment, the non-MIR beam can also be combined with the MIR beams to provide a multiple band assembly output beam.

As used herein, to be classified as a MIR laser source, the MIR beam of the MIR laser source has a wavelength in the range of approximately 3-14 microns. Stated in another fashion, as used herein, the MIR range is approximately 3-14 microns. As used herein, the MIR range can include (i) a MWIR range of approximately 3-5 microns, and (ii) a LWIR range of approximately 8-12 microns.

Further, as used herein, the term "combines" shall mean (i) that the beams are directed parallel to each other (e.g., travel along parallel axes), and (ii) that the beams are fully overlapping, partly overlapping, or are adjacent to each other.

In one embodiment, each of the MIR laser sources 18A-18C includes a quantum cascade ("QC") gain media. Estimates of the efficiency of such quantum cascade laser sources indicate the power draw to be an average of 5.8 watts or a peak power draw of approximately 46.0 watts while the laser sources are active.

With this design, electrons transmitted through the QC gain media emit one photon at each of the energy steps. In the case of a QC gain media, the "diode" has been replaced by a conduction band quantum well. Electrons are injected into the upper quantum well state and collected from the lower state using a superlattice structure. The upper and lower states are both within the conduction band. Replacing the diode with a single-carrier quantum well system means that the generated photon energy is no longer tied to the material bandgap. This removes the requirement for exotic new materials for each wavelength, and also removes Auger recombination as a problem issue in the active region. The superlattice and quantum well can be designed to provide lasing at almost any photon energy that is sufficiently below the conduction band quantum well barrier. As used herein the term QC gain media shall also include Interband Cascade Lasers (ICL). ICL lasers use a conduction-band to valence-band transition as in the traditional diode laser. In one, non-exclusive embodiment, the semiconductor QCL laser chip is mounted epitaxial growth side down and has a length of approximately four millimeters, a width of approximately one millimeter, and a height of approximately one hundred microns. A suitable QC gain media can be purchased from Alpes Lasers, located in Switzerland.

In certain embodiments, one or more of the laser sources 18A-18C can include a wavelength selective element that allows the wavelength of the respective beam to be individually tuned. The design of the wavelength selective element can vary. Non-exclusive examples of suitable wavelength selective elements include a diffraction grating, a MEMS grating, prism pairs, a thin film filter stack with a reflector, an acoustic optic modulator, or an electro-optic modulator. Further, a wavelength selective element can be incorporated in one or more of the gain media. A more complete discussion of these types of wavelength selective elements can be found in the Tunable Laser Handbook, Academic Press, Inc., Copyright 1995, chapter 8, Pages 349-435, Paul Zorabedian, the contents of which are incorporated herein by reference.

In non-exclusive examples, the laser sources 18A-18C can be designed so that the linewidth of each beam is less than approximately 5, 4, 3, 2, 1, 0.8, 0.5, or 0.1 $cm^{-1}$. Alternatively, the laser sources 18A-18C can be designed so that the line width of each beam is greater than approximately 7, 8, 9, or 10 $cm^{-1}$. The spectral width of the beams can be adjusted by adjusting the cavity parameters of the external cavity of the respective laser sources 18A-18C. For example, the spectral width of the beams can be increased by decreasing wavelength dispersion of the intracavity wavelength selector.

The power source 14 provides power to the system controller 16 that is directed to the laser assembly 12. In certain embodiments, the power source 14 includes one or more batteries that allow for portable usages for the assembly 10. Batteries have a small amount of equivalent series resistance (ESR) which limits the amount of current which may be available. In order to overcome the limitations of the batteries due to ESR, it is necessary to average the power draw from the batteries to reduce the peak power consumption down to the average power requirement.

In one non-exclusive embodiment, the power source 14 can include four, rechargeable, 3.6 volt lithium batteries that are connected in series. Alternatively, the power source 14 can be designed to include more than four or fewer than four batteries, and/or the voltage of each battery can be different than the example provided herein.

The specifications of the lithium batteries noted above indicate a typical 500 mΩ series resistance per cell or 2Ω for the full stack of four such lithium batteries. This series resistance will limit the maximum amount of current which can be drawn from the full battery stack. For example, for this particular battery arrangement, by itself, the maximum current draw available from fully charged batteries will be not be large enough to provide the peak power required to operate the assembly 10. More particularly, too much of the battery voltage will be dropped across the internal resistance of the battery stack generating heat dissipated in the batteries.

Additionally, in one embodiment, the current source 20 can further include a DC-DC voltage converter. In such embodiment, the batteries will power the voltage converter, which is then used to convert the battery voltage to the required operating voltage for the quantum cascade devices. Moreover, the expected battery input voltage can be approximately 14.4 volts for fully charged batteries and may drop as low as 8.0 volts when the batteries are nearly depleted. The quantum cascade devices require approximately twelve to fourteen volts at approximately four amps for normal operation. Further, it is estimated that the voltage convertor will be able to achieve approximately 90% conversion efficiency. Thus, the peak power draw from the batteries is expected to be approximately 51.0 watts, while the average power requirement is 6.4 watts. This high peak power requirement can be problematic when operating from lithium ion battery cells due to their relative high series resistance.

The assembly monitor 15, e.g., the FPGA, assists in monitoring and/or controlling various other features and functions of the assembly 10. For example, for different applications, the assembly monitor 15 can assist with the monitoring and/or controlling of the laser pulses, the current and the voltage that are utilized and/or generated within the assembly 10.

The system controller 16 directs power to the laser assembly 12 in a fashion that allows for sufficient power of the assembly output beam, while allowing for a relatively long operational life for a given battery charge. The design of the system controller 16 can be varied pursuant to the teachings provided herein. In FIG. 1, the system controller 16 includes a current source 20, a capacitor assembly 22, a power supply 24, and a switch assembly 26.

In certain embodiments, an average optical power output of 300 milliwatts is required to meet the range requirements of the assembly 10. Thus, to maximize operating efficiency of the quantum cascade devices, in some such embodiments, the system controller 16 directs power in a pulsed fashion to the laser assembly 12. As a result thereof, the intensity of the assembly output beam is also pulsed. In one, non-exclusive embodiment, the duty cycle is approximately 12.5 percent, which can provide a peak power output of approximately 2.4 watts. In this embodiment, for example, the system controller 16 can consist of 25 millisecond wide pulses at a rate of 5 Hz. Stated another way, the system controller 16 can cycle between directing power to the laser assembly 12 for approximately 25 milliseconds, and not directing power to the laser assembly 12 for approximately 175 milliseconds. Alternatively, the duty cycle can be greater than or less than 12.5 percent. With this design, the system controller 16 selectively adjusts a pulse width and a repetition rate of the assembly output beam.

As provided herein, with this design, the QC gain media lases with little to no heating of the core of the QC gain media, the average power directed to the QC gain media is relatively low, and the desired average optical power of the assembly output beam can be efficiently achieved. The optical power generated by the QC gain media core has a dependence on two temperature variables; average heat sink temperature, which depends on average power dissipation, and QC core temperature, which has a strong dependence on pulse width. Increasing core temperature results in decreasing optical power.

By operating at low duty factors, such as 12.5%, the average temperature of the heat sink is not strongly affected, and this is beneficial for producing optical power. The QC core has extremely low thermal conductivity and is strongly affected by electrical pulse width. This is primarily due to very low thermal conductivity of the quantum well layers in the core. For example, beyond five uSec, the core has temperature has nearly reached the high temperature achieved in CW operation.

While short pulse operation is desirable for maintaining lowest QCL core heating and maximizing optical power, it is not optimum for IR imager detection. It is recognized that a system tradeoff must be made between IR source operation and IR thermal imager response.

IR thermal imagers have inherent noise which must be overcome by the IR source in order to be detected. IR thermal imagers such as Microbolometer arrays integrate photons incident on a detector element during a frame. To optimize detection of a pulsed IR source, the pulse length should be adjusted to ensure illumination of the detector element(s) for a complete frame. For LWIR imagers, such as Microbolometer arrays, the frame on-time is approximately ten mSec, and the time between frames is approximately two and one-half mSec. Therefore, in this example, the pulse length of the IR source should be ten to twenty-five mSec.

For a given peak power from the QCL source, shorter pulses may not be detectable. As provided earlier, pulse widths less than approximately five uSec are required to substantially reduce the core temperature and thus result in more peak power. But this is approximately three orders of magnitude shorter than the frame time of the IR imager, and with five uSec pulse width the QCL source does not produce three orders of magnitude more photons. More typically the peak power might be only twice that of the peak power during a twelve and one-half mSec pulse. After taking these factors into consideration, it is recognized that the QCL source pulse length must be used in long pulse operation in certain embodiments. It should be noted that as the temperature of the QC gain media increases, the efficiency of the QC gain media decreases. With this embodiment, the pulsing of the QC gain media keeps the QC gain media operating efficiently and the overall system utilizes relatively low power.

It should be noted that in the pulsed mode of operation, the system controller 16 can simultaneously direct pulses of power to each of the laser sources 18A-18C so that each of the laser sources 18A-18C generates its respective beam at the same time. Alternatively, the system controller 16 can direct pulses of power to one or more of the laser sources 18A-18C at different times so that the laser sources 18A-18C generate their respective beams at different times.

In one non-exclusive embodiment, at least approximately fifty watts of power is required to pulse all of the laser sources 18A-18C simultaneously. Between pulses of the laser sources 18A-18C, almost no power is required. With a duty cycle of approximately 12.5 percent, the average power consumed by the laser assembly 12 is five to six watts.

As an overview, the system controller 16 is uniquely designed so that the battery power source 14 does not have to provide the fifty watts of power during the pulsing of the laser sources 18A-18C. Generally, it is very inefficient to draw large amounts of power from batteries. With the present invention, the system controller 16 charges the capacitor assembly 22 in between pulses of power to the laser assembly 12, and the capacitor assembly 22 and the power source 14 provide power to the laser assembly 12 during each pulse of power.

The current source 20 is in parallel with the power source 14, receives power from the power source 14 and directs power from to the power source 14 to the capacitor assembly 22 and the power supply 24. In one embodiment, the current source 20 is programmable and includes a microprocessor. With this design, the current source 20 can adjustably control the voltage Vc and current Ic that are directed to the capacitor assembly 22 and the laser assembly 12 during each pulse and between pulses. With this design, the programmable current source 20 can change the charge rate during and between pulses. In certain embodiments, the current source 20 receives feedback from the capacitor assembly 22 that is used to control the voltage that is directed to the capacitor assembly 22. Stated in another fashion, the programmable current source 20 can monitor the state of the capacitor assembly 22 (e.g., how much current is going to the capacitor assembly 22) and adjust the voltage accordingly so that the capacitor assembly 22 can be charged at a controlled rate.

Figure 8:
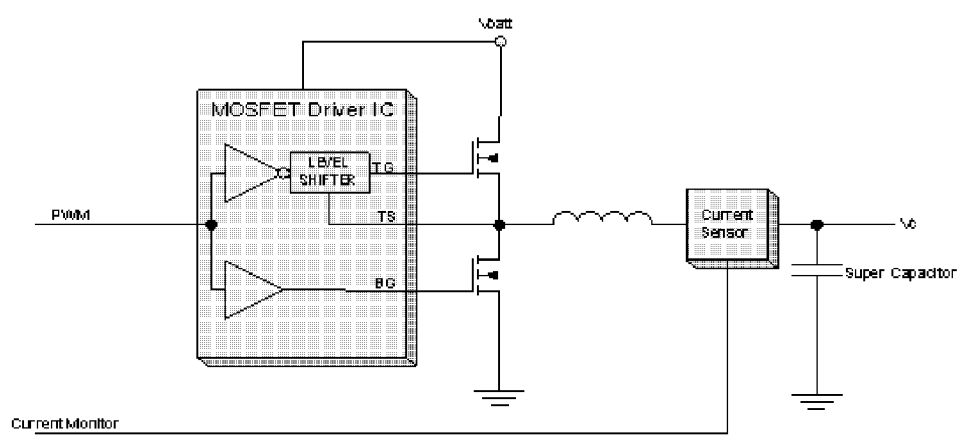
FIG. 8 is a simplified electrical schematic of an embodiment of a current source having features of the present invention.

In one embodiment, the programmable current source 20 can be a buck topology switching power supply. A simplified electrical schematic of an embodiment such a current source 20 is illustrated in FIG. 8. In particular, by adjusting the duty cycle of a PWM control signal, the output voltage measured at $V_c$ will be controlled by the FPGA 15 (illustrated in FIG. 1) control circuit to maintain the desired charge current. This current is measured between the inductor and the super capacitor using a hall-effect, isolated current sensor. This current sensor has a high enough bandwidth to allow a control loop in the FPGA 15 to monitor and control the charge current quickly and with high precision. Using a digital control loop also provides the flexibility of adjusting the battery current dynamically as a function of the battery voltage, operating power, temperature, and laser operational characteristics. With characterization, control algorithms may be developed to optimize power consumption from the batteries in order to achieve the desired operating time.

The capacitor assembly 22 is in parallel with the current source 20, provides pulses of power to the laser assembly 12 to drive current in the QC laser devices, and is used to reduce the amount of power drawn from the batteries during the pulses of power. The output of the capacitor assembly 22 supplies power to the DC-DC converter. Additionally, the DC-DC converter can have an adjustable output voltage to set the operating voltage of the quantum cascade lasers. In one embodiment, the component chosen is an integrated power supply module 24 with very fast transient response time, which can operate from input voltages ranging from 3.6 volts to well above the 14.4 volts expected from the batteries. The buck-boost topology of this module allows the output voltage to be boosted up or regulated down to the required operating point depending on the input voltage. Moreover, these modules can provide up to five amps of continuous current.

In order to provide the desired averaging of the power drawn from the batteries, the capacitor assembly 22 can include one or more super capacitors that are connected in parallel. A super capacitor is a large value capacitor with much lower ESR than the batteries. The super capacitors can be used to store charge from the batteries between laser pulses and provide the necessary current to drive the laser sources during the short laser pulses.

In the embodiment illustrated in FIG. 1, the capacitor assembly 22 includes three super capacitors 28A-28C. Alternatively, the capacitor assembly 22 can include more than three or fewer than three super capacitors 28A-28C. In one embodiment, the capacitor assembly 22 provides capacitance of approximately one hundred and twenty millifarads and a series resistance of approximately one hundred and sixty mΩ. Alternatively, the capacitor assembly 22 can have a capacitance of more than or less than one hundred and twenty millifarads. Still alternatively, the capacitor assembly 22 can provide a series resistance of more than or less than one hundred and sixty mΩ.

During the on-cycle of the laser pulses, current will be drawn, primarily, from the capacitor assembly 22, i.e. from the one or more super capacitors. This will cause a reduction in the operating voltage of the capacitor assembly 22. The change in voltage is dependent on the current according to the following equation:

$$i = C \frac{\partial v}{\partial t}$$

where C is the capacitance value. By drawing some current, typically less than 1 amp, from the batteries during the laser pulse, the amount of voltage drop across the capacitor assembly 22 can be limited.

Between laser pulses, the programmable current source 20 will recharge the capacitor assembly 22, i.e. the super capacitors, to the maximum voltage available from the batteries. The rate of this charge can be monitored by the FPGA 15 and can be adjusted as necessary. Ideally, the charge rate would be the minimum amount required to recharge the capacitor assembly 22 between pulses. This rate will further vary depending on the battery operating voltage.

Figure 2:
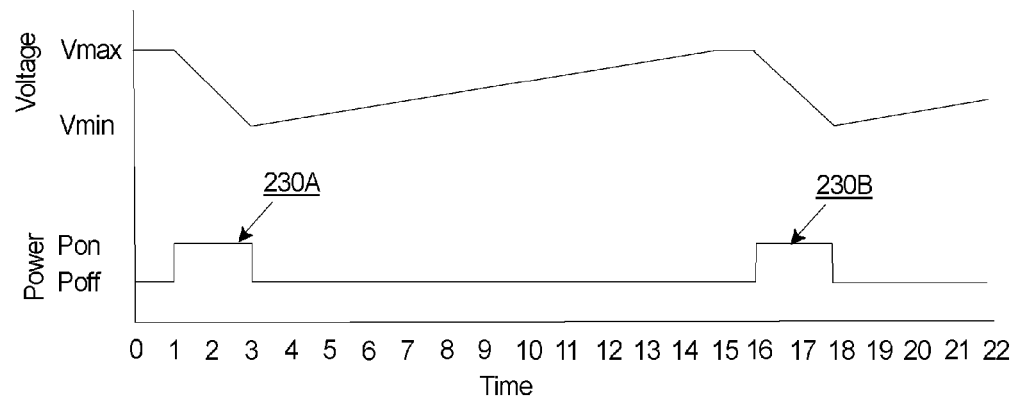
FIG. 2 is a simplified graph that illustrates the voltage in a capacitor assembly and the pulses of power directed to a laser assembly versus time.

FIG. 2 is a simplified graph that illustrates power directed to the laser assembly 12 (illustrated in FIG. 1) and a voltage of the capacitor assembly 22 (illustrated in FIG. 1) versus time. More specifically, FIG. 2 illustrates a first pulse of power 230A and a second pulse of power 230B that are directed to the laser assembly 12, and the voltage of the capacitor assembly 22 during this time. Between the time t=0 and t=1, the power is off (Poff—no power is directed to the laser assembly 12) and the capacitor assembly 22 is at maximum voltage (Vmax). Subsequently, during the first pulse of power 230A (from t=1 to t=3) the power is on (Pon—power is directed to the laser assembly 12), and the voltage in the capacitor assembly 22 is gradually dropping from Vmax to Vmin. Thus, during the first pulse of power 230A, the capacitor assembly 22 is providing power to the laser assembly 12.

Next, in between the first pulse of power 230A and the second pulse of power 230B (from t=3 to t=16), the power is off, and the capacitor assembly 22 is being recharged from Vmin to Vmax. With this design, prior to the second pulse of power 230B, the capacitor assembly 22 is fully recharged and ready to provide power for the second pulse of power 230B. This sequence is repeated during operation of the assembly 10 (illustrated in FIG. 1).

In one non-exclusive embodiment, assuming a battery voltage of 2.2 volts per cell and a fixed maximum battery current of one amp, the capacitor assembly 22 voltage decreases from 8.8 volts at the beginning of the laser pulse to approximately 7.6 volts at the end of the 25 millisecond laser pulse. After the laser pulse is terminated, the one amp current from the battery charges the capacitor assembly 22 back to 8.8 volts during the 175 milliseconds between laser pulses. Thus, the batteries never provide more than one amp of current while the capacitor assembly provides up to six amps of current during the laser pulse.

It should be noted that the rate at which the capacitor assembly 22 can be charged between pulses of power can be varied and controlled by the current source 20 (illustrated in FIG. 1). Further, during each pulse, the amount of power provided by the capacitor assembly 22 and the amount of power provided by the power source 14 (illustrated in FIG. 1) can be programmably controlled by the current source 20. As non-exclusive examples, during each pulse of power 230A, 230B the ratio of power provided by the capacitor assembly 22 versus power provided by the power source 14 can be approximately 70/30, 75/25, 80/20, 85/15, 90/10, or 95/5. However, other ratios are possible and are individually adjustable with the current source 20.

Referring back to FIG. 1, the power supply 24 is in parallel with the capacitor assembly 22, and receives power from the capacitor assembly 22 and the power source 14.

The switch assembly 26 is controlled to selectively direct the pulses of power to the laser sources 18A-18C. In FIG. 1, the switch assembly 26 includes (i) a first switch 32A that controls the power to the first laser source 18A, (ii) a second switch 32B that controls the power to the second laser source 18B, and (iii) a third switch 32C that controls the power to the third laser source 18C. In one embodiment, each switch 32A-32C can be a transistor that is independently controlled. This allows for individual operation of the laser sources 18A-18C for built-in testing or verification of laser operation, as well as allowing operation of a single laser source 18A-18C to achieve low power training mode.

With this design, in the pulsed mode of operation, the switches 32A-32C can be controlled to simultaneously direct pulses of power to each of the laser sources 18A-18C so that each of the laser sources 18A-18C generates its respective beam at the same time. Alternatively, the switches 32A-32C can direct pulses of power to one or more of the laser sources 18A-18C at different times so that the laser sources 18A-18C generate their respective beams at different times.

The current through each of the laser sources 18A-18C is determined by the amount of voltage applied and is monitored, e.g., with the assembly monitor 15. Because of the relatively large dynamic resistance of quantum cascade devices, switched voltage operation is an acceptable control method. This is in contrast to other types of semiconductor laser diodes which have very small dynamic range and, therefore, can have very large changes in current due to very small fluctuations in voltage.

Additionally, the operating voltage can connect through a hall-effect current sensor so that the current to the laser sources 18A-18C can be monitored. In one embodiment, for space savings, a single current sensor can be used. By staggering the turn-on of the three devices, individual currents can be measured. All devices, however, will operate from the same voltage source. An operating point will be chosen which is satisfactory for all devices.

In FIG. 1, there is a single power supply 24. Thus, each laser source 18A-18C will receive the same voltage with a standard switch. Alternatively, the system controller 16 can include a separate power supply (not shown) for each laser source 18A-18C so that each laser source 18A-18C can receive a different current or voltage.

Figure 3:
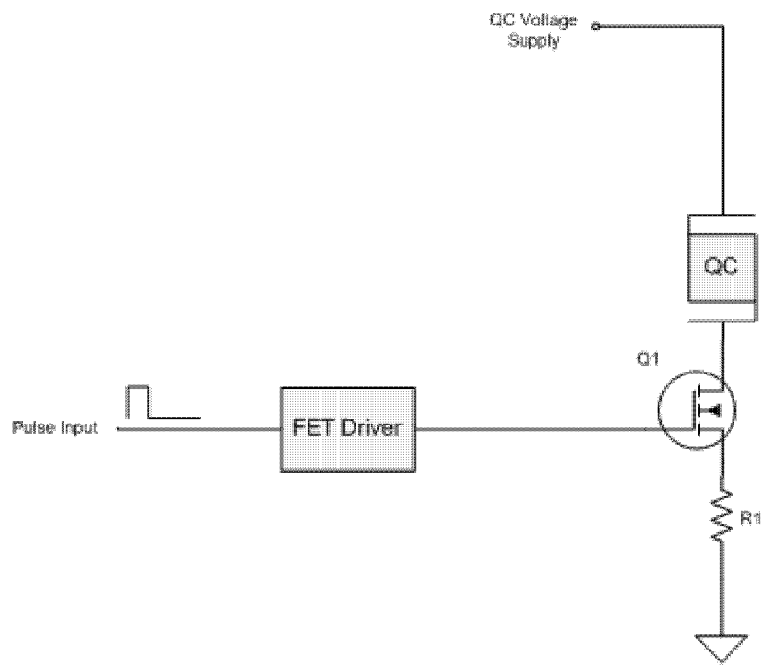
FIG. 3 is a simplified electrical schematic of a first embodiment of a switch having features of the present invention.

FIG. 3 is a simplified electrical schematic of one, non-exclusive embodiment of a switch that can be used to selectively direct power to one of the laser sources 18A-18C (illustrated in FIG. 1). For example, the switch illustrated in FIG. 3 can be utilized as one or more of the switches 32A-32C illustrated in FIG. 1. In this embodiment, the switch is a compact, ceramic board with surface mount components including two electronic components in semiconductor die form. The circuit is designed to be small enough to mount inside the package and utilizes a ceramic board to provide heat sinking of components used to switch the device operating current. The design of the circuitry allows for two assembly variants, i.e. to support either series switched voltage control (illustrated in FIG. 3) or shunt switched current control (illustrated in FIG. 4).

In FIG. 3, the switch is a series switched voltage control switch. In this embodiment, the drive circuit can be built to utilize a series switch to connect a supply voltage across the laser source (labeled "QC"). In this embodiment, a fixed voltage source (shown as "QC Voltage Supply") is applied to one connection of the laser source QC and the other connection of the laser source QC connects to a series FET switch, Q1. To turn the laser source QC off, the FET switch Q1 is turned off, preventing the flow of current from the QC Voltage Supply. To pulse the laser source QC on, a pulse input is provided to the FET Driver integrated circuit. This FET Driver provides the necessary voltages to turn on the FET switch Q1 quickly. When the FET Driver turns on the FET switch Q1, the circuit is completed and current can begin to flow from the QC Voltage Supply through the laser source QC, the FET switch Q1, and sense resistor R1. By measuring the voltage across the sense resistor R1, the current can be measured. Since the resistance value of the sense resistor R1 is small, the current through the laser source QC is primarily determined by the current-voltage relationship of the particular laser source.

This type of circuit provides good switching performance; however, the current through the device is not directly regulated. Variations of the current-voltage relationship of the laser source QC can result in an increase or decrease or operating current. In some cases, this could lead to damage to the laser source QC, if the current increases sufficiently.

Figure 4:
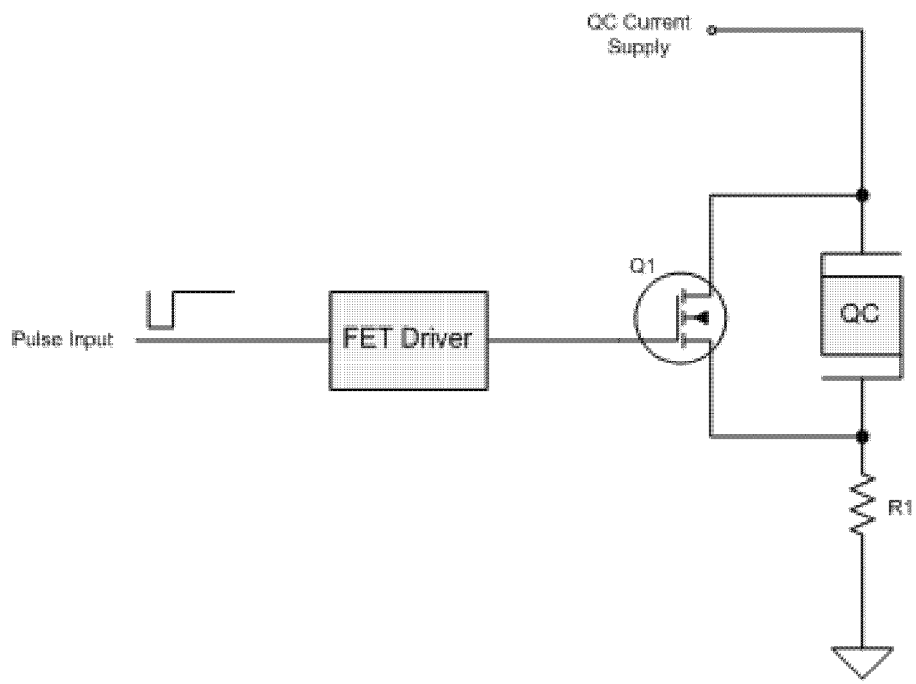
FIG. 4 is a simplified electrical schematic of another embodiment of a switch having features of the present invention.

FIG. 4 is a simplified electrical schematic of another embodiment of a switch that can be used to selectively direct power to one of the laser sources 18A-18C (illustrated in FIG. 1). For example, the switch illustrated in FIG. 4 can be utilized as one or more of the switches 32A-32C illustrated in FIG. 1. In this embodiment, the switch is a shunt switched current control switch. More specifically, in this embodiment, the drive circuit can also be built to utilize a shunt switch to direct a QC Current Supply through the laser source ("QC") or to shunt the QC Current Supply around the laser source QC.

In FIG. 4, the laser source is connected in parallel with a FET switch, Q1. A constant QC Current Supply is connected to this parallel combination. In order to turn off the laser source QC, the FET switch Q1 is activated by a FET Driver circuit. With the FET switch Q1 fully on, the QC Current Supply is directed through the FET switch Q1 and very little current flows through the laser source QC. To activate the laser source QC, the FET switch Q1 is deactivated and current flow is redirected through the laser source QC. The current also flows in sense resistor R1, which is used to measure the amount of current. The QC Current Supply is designed to provide the commanded current whether the current is flowing through the short circuit of the FET switch Q1 or through the voltage drop of the laser source QC. In this case, then, the current through the laser source QC is determined by the QC Current Supply, not by the current-voltage characteristics of the laser source QC.

This design relies on a regulator current source to control the amount of current flowing through the laser source QC. Voltage variations of the laser source QC will not result in increases or decreases of the current. However, in certain embodiments, when activating the FET switch Q1 to turn off the laser source QC, a stored charge in the laser source QC can be caused to flow back through the FET switch Q1 resulting in a substantial negative current spike. In some cases, this can cause damage to the laser source QC. Preventing this negative spike has traditionally meant that the pulse performance of the circuit must be reduced.

In yet another embodiment, one or more of the switches 32A-32C can be a current regulator that individually controls the operating current that is directed to each laser source 18A-18C. With this design, each of the switches 32A-32C can be controlled so that the laser sources 18A-18C are operated at different currents or voltages even though there is a common voltage source.

Figure 5:
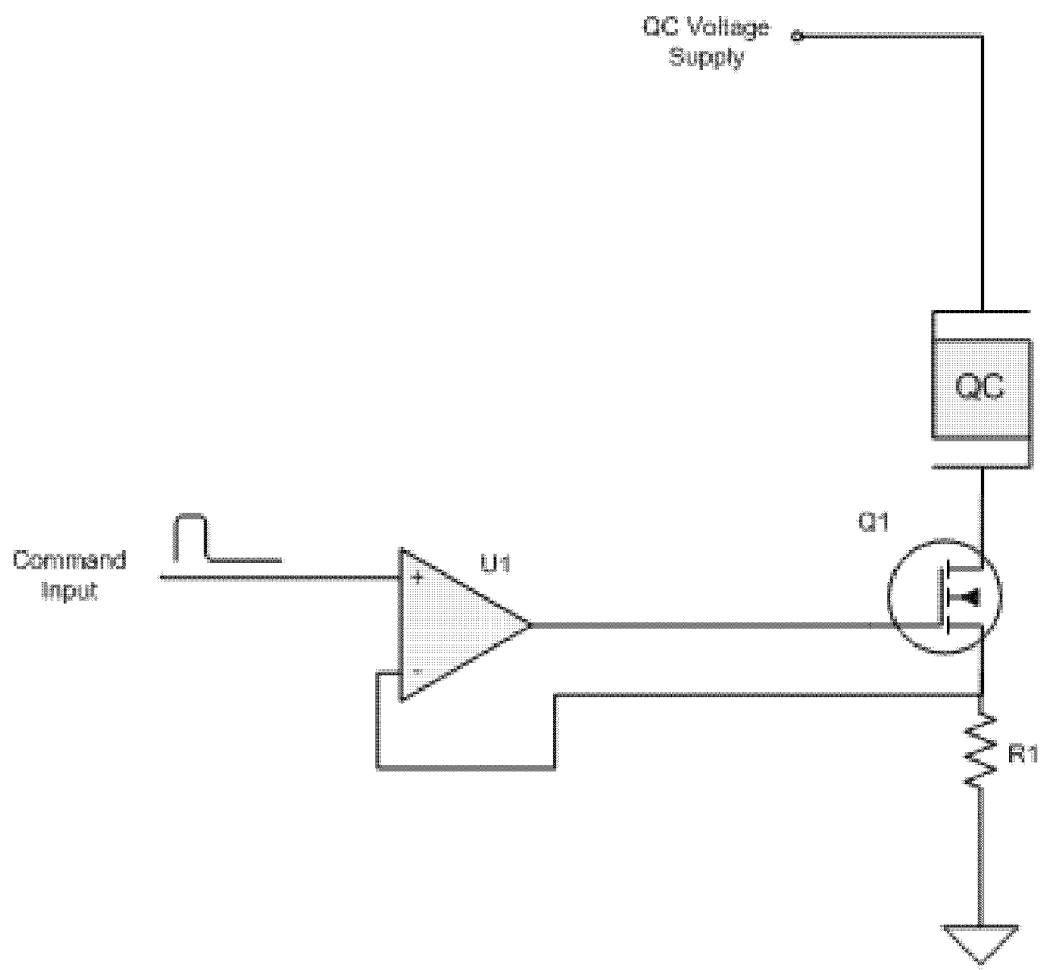
FIG. 5 is a simplified electrical schematic of a current regulator having features of the present invention.

FIG. 5 is a simplified electrical schematic of one, non-exclusive example of a current regulator having features of the present invention that provides faster switching time of the laser source while maintaining a constant current regulation. In the embodiment illustrated in FIG. 5, a voltage source ("QC Voltage Supply") is connected to the laser source ("QC"). The other connection of the laser source QC is connected to a series FET switch, Q1, and a sense resistor, R1. A Command Input signal is applied to one input of an operational amplifier, U1. In order to turn off the laser source QC, the Command Input is set to 0V. The operational amplifier U1 output will turn off the FET switch, Q1, preventing current from flowing. To turn on the laser source QC, the Command Input voltage is increased. The operational amplifier U1 will drive the gate of the FET switch, Q1, so that current begins to flow through the laser source QC and through the sense resistor, R1. The voltage across the sense resistor R1 is proportional to the current flowing, and this voltage is connected back to the negative input of the operational amplifier, U1. The operational amplifier U1 will act to increase the current flow through the sense resistor R1 until this voltage is equal to the Command Input voltage. Thus, the amount of current flowing through the laser source QC will be proportional to the voltage level of the Command Input.

In this embodiment, by designing this circuit to be very small, and placing it in close proximity to the laser source QC, parasitic capacitance and inductance can be minimized allowing for the best performance characteristics for this current regulator. The result is improved pulse performance while maintaining strict current regulation. This will, in turn, provide better protection for the laser source QC.

It should be noted that the use of a current regulator allows for the individual control of the laser sources 18A-18C (illustrated in FIG. 1) to account for variations in the laser sources 18A-18C and specific adjustment of the assembly output beam. For example, with this design, the current regulators can individually adjust the current and voltage to each of the laser sources 18A-18C to achieve the desired characteristics of the assembly output beam.

Further, the current regulator is able to provide shorter pulses with less chance of damaging voltage spikes.

Figure 6A:
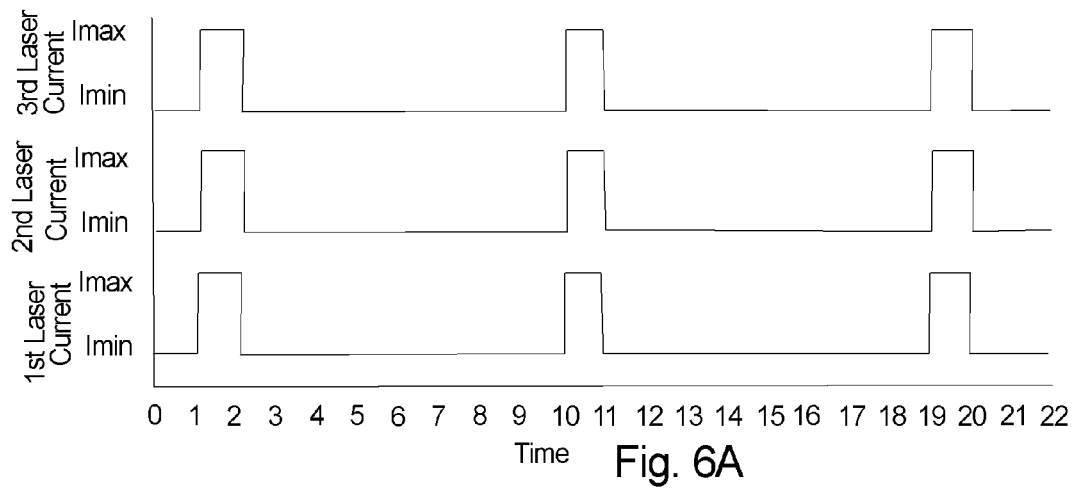
FIG. 6A-6C are alternative graphs that illustrate current directed to three lasers versus time.
Figure 6B:
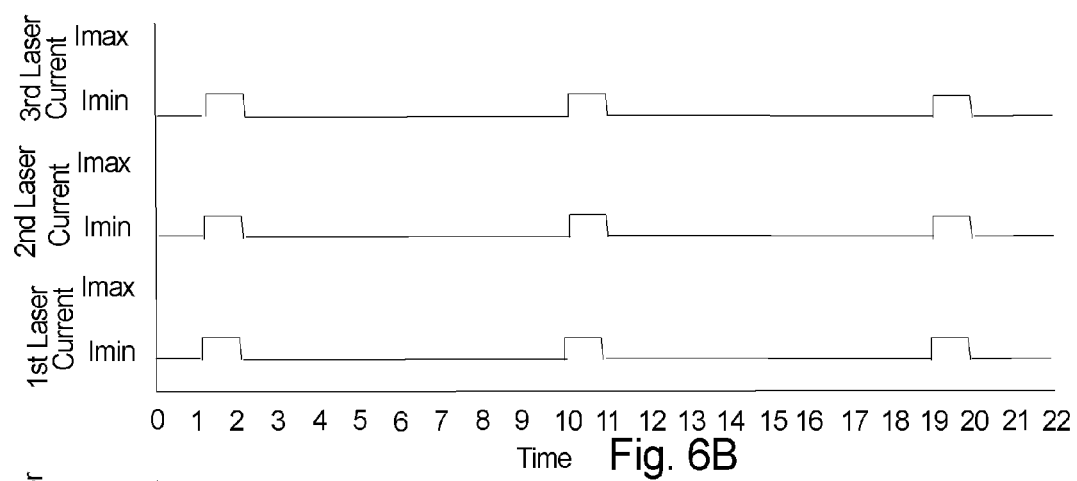
Figure 6C:
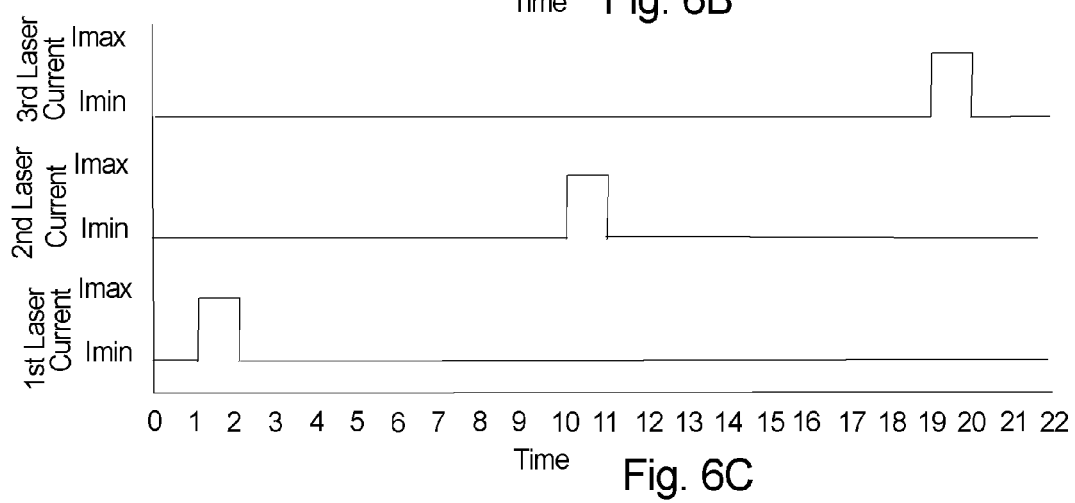

FIGS. 6A-6C are alternative graphs that illustrate current directed to three lasers versus time. FIG. 6A is a graph that illustrates the normal operation of the assembly in which a pulsed, near maximum current is directed to each laser simultaneously. In this embodiment, the exact current to each of the lasers can be finely and individually tuned to achieve the desired assembly output beam and desired performance of the assembly 10 (illustrated in FIG. 1).

In certain embodiments, it may be desirable to operate the assembly 10 at less than full power. For example, for a laser targeting application, during training exercises, it may be desirable to operate the assembly 10 at less than full power, e.g., an eye-safe mode in which the assembly output beam can be pointed at a person without the assembly output beam harming the eyes of the target. As non-exclusive examples, this can be accomplished by pulsing only one laser source, sequentially pulsing the lasers, or directing a reduced amount of current to each of the laser sources.

FIG. 6B is a graph that illustrates one non-exclusive example of how current can be directed to the laser sources in an eye safe mode. In this example, a pulsed, much less than maximum current is directed to each laser simultaneously. In this example, the amount of current ($I_{tm}$, current training mode) to each laser source is approximately equal, and much less, e.g., approximately 10, 20, 25, 30, 35, 40, or 50 percent of the maximum current. Again in this design, the exact current to each of the lasers can be finely and individually tuned to achieve the desired assembly output beam and desired performance of the assembly 10 (illustrated in FIG. 1).

FIG. 6C is a graph that illustrates another, non-exclusive example of how current can be directed to the laser sources in an eye-safe mode. In this example, a pulsed, almost maximum current is directed to each laser sequentially. In this example, the amount of current ($I_{tm}$, current training mode) to each laser source is less, e.g., approximately 50, 60, 70, 80, 90, or 95 percent of the maximum current. Again in this design, the exact current to each of the lasers can be finely and individually tuned to achieve the desired assembly output beam and desired performance of the assembly 10 (illustrated in FIG. 1).

Figure 7A:
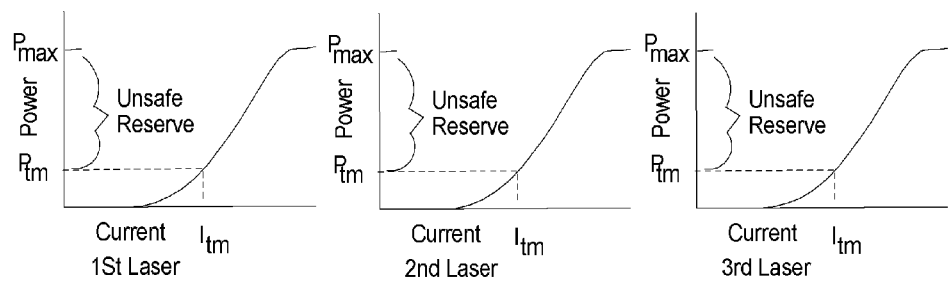
FIGS. 7A and 7B are alternative graphs that illustrate power versus current curves.

FIG. 7A includes a number of graphs that show power output versus current for a pulse that indicate a possible problem with a training mode where three Quantum Cascade lasers are run simultaneously at a relatively low training current $I_{tm}$. In this example, training current for a given QC chip is selected so that the power $P_{tm}$ for each laser is one third of desired training mode (eye-safe) optical power. With this design, with multiple QC lasers (two or more), running simultaneously substantially below their maximum power, there is an amount of power in reserve that is well above the desired eye-safe level. This reserve power may be released due to electrical noise or spurious optical feedback such as glint from a visor, eyeglasses, etc. A lesser but compounding concern is that the effect of electrical noise (spikes, drift, etc.) upon the laser output power is relatively greater when the individual QC lasers are running relatively closer to threshold currents. Finally, in this scenario, fractionally greater current is wasted as heat (the current below threshold) without benefit of optical output (current beyond threshold).

Figure 7B:
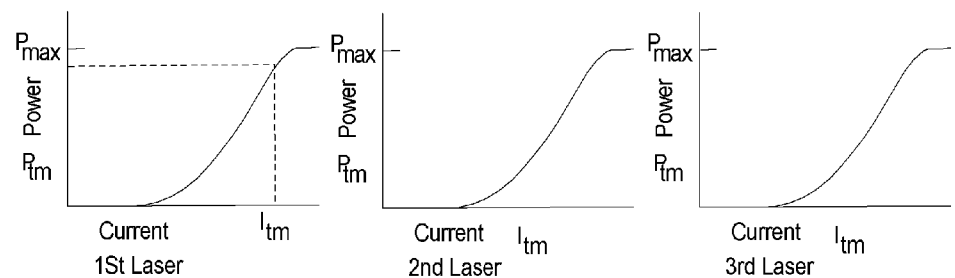

FIG. 7B includes a number of graphs that show power output versus current for a pulse. In this case, two of three QC lasers receive no current and are in fact "switched off". All of the optical power for training mode is extracted from 1 QC chip running well above threshold current and putting out close to the maximum amount of available power. The output power has a maximum due to device physics: the slope decreases to zero and even becomes negative at higher currents due to heating of the active region. This "thermal rollover" is well known, characteristic, repeatable and ineluctable. The reserve power in this case is minimal and may be kept at an eye-safe limit.

Note that the efficiency is also improved: the current above threshold/current below threshold is much greater than in the previous case.

The only down side to this operational mode is that it could cause uneven wear-out of otherwise similar QC gain chips, thereby unnecessarily limiting the useful life of the system. To address this, what is needed is a means to time-share the eye-safe training mode among the three QC lasers by switching through permutations of one-on/two-off.

Based on the teachings as provided herein, i.e. using the capacitor assembly 22 to average out the power drawn from the batteries and avoiding the very large current surges when the laser sources 18A-18C are operating, the operational lifetime of the batteries can be dramatically improved. For example, due to such features, the assembly 10 may be able to operate with battery voltages as low as two volts per cell. Additionally, the average power drawn from the batteries can be approximately 6.4 watts. Further, use of four lithium batteries, as described above, can provide up to sixteen W/hours when operating at or above 25 C ambient temperature. Accordingly, it is estimated that the assembly 10 could achieve at least approximately two hours of continuous operation.

While a number of exemplary aspects and embodiments of an assembly 10 have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. An assembly for providing an assembly output beam, the assembly comprising:
   a laser assembly including a first laser source;
   a power source that is electrically coupled to the laser assembly, the power source including at least one battery;
   a capacitor assembly that is electrically connected to the laser assembly and the power source;
   a programmable current source that is electrically connected between the power source and the capacitor assembly, the current source selectively controlling a voltage and current that is directed to the capacitor assembly from the power source;
   a power supply that is electrically connected to the laser assembly, the capacitor assembly, the current source, and the power source, the power source controlling the voltage that is directed to the laser assembly; and
   a first switch that is electrically connected to the laser assembly, the power supply and the capacitor assembly, the first switch directing pulses of power to the first laser source;
   wherein the programmable current source selectively and adjustably controls the voltage and current that are directed to the capacitor assembly during each pulse and between pulses to adjust a rate of charging of the capacitor assembly between pulses; wherein the programmable current source receives feedback regarding the state of the capacitor assembly and adjusts the voltage to the capacitor assembly to charge the capacitor assembly at a controlled rate.

2. The assembly of claim 1 wherein the laser assembly includes a second laser source that is connected in parallel with the first laser source, the assembly further comprising a second switch that directs pulses of power to the second laser source.

3. The assembly of claim 2 wherein the first switch includes a first current regulator that regulates current to the first laser source, and wherein the second switch includes a second current regulator that regulates current to the second laser source.

4. The assembly of claim 1 wherein the power supply includes a converter that selectively boosts up or regulates down the voltage to set the operating voltage of the laser assembly.

5. The assembly of claim 1 wherein the first switch includes a first current regulator that regulates current to the first laser source.

6. The assembly of claim 1 wherein during each pulse of power to the first laser source, the current will be provided to the first laser source primarily from the capacitor assembly, and wherein between each pulse of power to the first laser source, the programmable current source will recharge the capacitor assembly at a minimum amount required to recharge the capacitor assembly between pulses.

7. The assembly of claim 6 wherein the current source controls and varies the rate at which the capacitor assembly is charged.

8. The assembly of claim 1 wherein the first laser source is a mid-infrared laser source.

9. An assembly for providing an assembly output beam, the assembly comprising:
   a laser assembly including a first laser source;
   a power source that is electrically coupled to the laser assembly, the power source including at least one battery;
   a capacitor assembly that is electrically connected to the laser assembly and the power source;
   a programmable current source that is electrically connected between the power source and the capacitor assembly, the current source selectively controlling a voltage and current that is directed to the capacitor assembly from the power source;
   a power supply that is electrically connected to the laser assembly, the capacitor assembly, the current source, and the power source, the power source controlling the voltage that is directed to the laser assembly; and a first switch that is electrically connected to the laser assembly, the power supply and the capacitor assembly, the first switch directing pulses of power to the first laser source;

wherein the programmable current source selectively and adjustably controls the voltage and current that are directed to the capacitor assembly during each pulse and between pulses to adjust a rate of charging of the capacitor assembly between pulses;

wherein the programmable current source dynamically adjusts the current from the battery to the capacitor assembly as a function of the battery voltage, operating power, temperature, and laser assembly operational characteristics.

10. The assembly of claim 9 wherein the laser assembly includes a second laser source that is connected in parallel with the first laser source, the assembly further comprising a second switch that directs pulses of power to the second laser source.

11. The assembly of claim 10 wherein the first switch includes a first current regulator that regulates current to the first laser source, and wherein the second switch includes a second current regulator that regulates current to the second laser source.

12. The assembly of claim 9 wherein the power supply includes a converter that selectively boosts up or regulates down the voltage to set the operating voltage of the laser assembly.

13. The assembly of claim 9 wherein the first switch includes a first current regulator that regulates current to the first laser source.

14. The assembly of claim 9 wherein during each pulse of power to the first laser source, the current will be provided to the first laser source primarily from the capacitor assembly, and wherein between each pulse of power to the first laser source, the programmable current source will recharge the capacitor assembly at a minimum amount required to recharge the capacitor assembly between pulses.

15. The assembly of claim 14 wherein the current source controls and varies the rate at which the capacitor assembly is charged.

16. The assembly of claim 9 wherein the first laser source is a mid-infrared laser source.

17. An assembly for providing an assembly output beam, the assembly comprising:

a laser assembly including a first mid-infrared laser source;

a power source that is electrically coupled to the laser assembly in parallel, the power source including at least one battery;

a capacitor assembly that is electrically connected to the laser assembly and the power source;

a programmable current source that is electrically connected between the power source and the capacitor assembly, the current source selectively controlling a voltage and a current that is directed to the capacitor assembly from the power source, the programmable current source receiving feedback regarding the state of the capacitor assembly and adjusts the voltage to the capacitor assembly to charge the capacitor assembly at a controlled rate;

a power supply that is electrically connected to the laser assembly, the capacitor assembly, the current source, and the power source, the power source controlling the voltage that is directed to the laser assembly, the power supply including a converter that selectively boosts up or regulates down the voltage to set the operating voltage of the laser assembly; and a first switch that is electrically connected to the laser assembly, the power supply and the capacitor assembly, the first switch selectively adjusting a pulse width and a repetition rate of pulses of power to the first laser source;

wherein the current source selectively and adjustably controls the voltage and current that are directed to the capacitor assembly during each pulse and between pulses to adjust a rate of charging of the capacitor assembly between pulses.

18. A targeting assembly comprising a thermal imager and the assembly of claim 17.

19. A weapon assembly comprising a weapon and the targeting assembly of claim 18.

20. The assembly of claim 17 wherein the laser assembly includes a second mid-infrared laser source that is connected in parallel with the first laser source, the assembly further comprising a second switch that directs pulses of power to the second laser source.

21. The assembly of claim 20 wherein the first switch includes a first current regulator that regulates current to the first laser source, and wherein the second switch includes a second current regulator that regulates current to the second laser source.

22. An assembly for providing an assembly output beam, the assembly comprising:

a laser assembly including a first laser source;

a power source that is electrically coupled to the laser assembly, the power source including at least one battery;

a capacitor assembly that is electrically connected to the laser assembly and the power source;

a programmable current source that is electrically connected between the power source and the capacitor assembly, the current source selectively controlling a voltage and current that is directed to the capacitor assembly from the power source;

a power supply that is electrically connected to the laser assembly, the capacitor assembly, the current source, and the power source, the power source controlling the voltage that is directed to the laser assembly; and a first switch that is electrically connected to the laser assembly, the power supply and the capacitor assembly, the first switch directing pulses of power to the first laser source;

wherein the programmable current source selectively and adjustably controls the voltage and current that are directed to the capacitor assembly during each pulse and between pulses to adjust a rate of charging of the capacitor assembly between pulses;

wherein during each pulse of power to the first laser source, the current will be provided to the first laser source primarily from the capacitor assembly, and wherein between each pulse of power to the first laser source, the programmable current source will recharge the capacitor assembly at a minimum amount required to recharge the capacitor assembly between pulses.

23. The assembly of claim 22 wherein the laser assembly includes a second laser source that is connected in parallel with the first laser source, the assembly further comprising a second switch that directs pulses of power to the second laser source.

24. The assembly of claim 23 wherein the first switch includes a first current regulator that regulates current to the first laser source, and wherein the second switch includes a second current regulator that regulates current to the second laser source.

25. The assembly of claim 22 wherein the power supply includes a converter that selectively boosts up or regulates down the voltage to set the operating voltage of the laser assembly.

26. The assembly of claim 22 wherein the first switch includes a first current regulator that regulates current to the first laser source.

27. The assembly of claim 22 wherein the current source controls and varies the rate at which the capacitor assembly is charged.

28. The assembly of claim 22 wherein the first laser source is a mid-infrared laser source.

* * * * *